(12) United States Patent
Hsu et al.

(10) Patent No.: US 9,299,657 B2
(45) Date of Patent: Mar. 29, 2016

(54) SEMICONDUCTOR DEVICE AND METHOD FOR MANUFACTURING SEMICONDUCTOR DEVICE

(71) Applicant: Taiwan Semiconductor Manufacturing Company Limited, Hsinchu (TW)

(72) Inventors: Audrey Hsiao-Chiu Hsu, Hsinchu (TW); Fu-Kai Yang, Hsinchu (TW); Mei-Yun Wang, Hsin-Chu (TW); Hsien-Cheng Wang, Hsinchu (TW); Shih-Wen Liu, Taoyuan County (TW); Hsin-Ying Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/140,155

(22) Filed: Dec. 24, 2013

(65) Prior Publication Data

US 2015/0179573 A1  Jun. 25, 2015

(51) Int. Cl.

| | | |
|---|---|---|
| *H01L 29/00* | (2006.01) | |
| *H01L 23/522* | (2006.01) | |
| *H01L 21/02* | (2006.01) | |
| *H01L 21/3205* | (2006.01) | |
| *H01L 21/768* | (2006.01) | |
| *H01L 23/485* | (2006.01) | |
| *H01L 23/532* | (2006.01) | |

(52) U.S. Cl.
CPC ........ *H01L 23/5228* (2013.01); *H01L 21/0223* (2013.01); *H01L 21/02178* (2013.01); *H01L 21/02186* (2013.01); *H01L 21/02252* (2013.01); *H01L 21/32051* (2013.01); *H01L 21/76897* (2013.01); *H01L 23/485* (2013.01); *H01L 23/53257* (2013.01); *H01L 2924/0002* (2013.01)

(58) Field of Classification Search
CPC ......... H01L 28/24; H01L 28/60; H01L 28/20; H01L 27/0629; H01L 27/0688; H01L 27/1085; H01L 23/485; H01L 23/5228; H01L 23/5384; H01L 23/5226; H01L 21/76811; H01L 21/28; H01L 21/76841
USPC .......................................... 257/536; 438/382
See application file for complete search history.

(56) References Cited

U.S. PATENT DOCUMENTS

| | | | | |
|---|---|---|---|---|
| 2006/0091447 | A1* | 5/2006 | Ema ............................... | 257/314 |
| 2007/0257323 | A1* | 11/2007 | Tsui et al. ...................... | 257/382 |
| 2009/0236581 | A1* | 9/2009 | Yoshida et al. ................. | 257/2 |

* cited by examiner

*Primary Examiner* — Trung Q Dang
(74) *Attorney, Agent, or Firm* — Jones Day

(57) ABSTRACT

A method for manufacturing semiconductor device is provided. The method includes the following operations: providing a first conductive portion, a second conductive portion and a third conductive portion over a substrate; forming a dielectric layer over the first conductive portion, the second conductive portion, and the third conductive portion; forming a high-resistance layer over the first conductive portion; forming an oxide layer over the high-resistance layer and the dielectric layer; patterning the dielectric layer and the oxide layer by using the high-resistance layer as a blocking layer to form a first recess to expose the second conductive portion and the third conductive portion and to prevent the first conductive portion from exposure; and forming a plug layer in the first recess to connect the second conductive portion and the third conductive portion.

20 Claims, 4 Drawing Sheets

SEMICONDUCTOR DEVICE AND METHOD FOR MANUFACTURING SEMICONDUCTOR DEVICE

FIELD

This disclosure relates generally to semiconductors, and, more particularly, to a semiconductor device and method for manufacturing a semiconductor device.

BACKGROUND

For nanometer semiconductor processes, a high-resistance process is gaining in popularity. Therefore, it will be helpful to take advantages of the high-resistance process for multiple purposes.

SUMMARY

According to an exemplary embodiment, a semiconductor device is provided. The semiconductor device includes: a first conductive portion over a substrate; a second conductive portion over the substrate; a third conductive portion over the substrate; a dielectric layer over the first conductive portion; a first high-resistance portion over the dielectric layer; and a first plug portion over the first high-resistance portion, the second conductive portion, and the third conductive portion, wherein the first plug portion electrically connects the second conductive portion and the third conductive portion.

According to an exemplary embodiment, a method for manufacturing semiconductor device is provided. The method includes: providing a first conductive portion, a second conductive portion and a third conductive portion over a substrate; forming a dielectric layer over the first conductive portion, the second conductive portion, and the third conductive portion; forming a high-resistance layer over the first conductive portion; forming an oxide layer over the high-resistance layer and the dielectric layer; patterning the dielectric layer and the oxide layer by using the high-resistance layer as a blocking layer to form a first recess to expose the second conductive portion and the third conductive portion and to prevent the first conductive portion from exposure; and forming a plug layer in the first recess to connect the second conductive portion and the third conductive portion.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
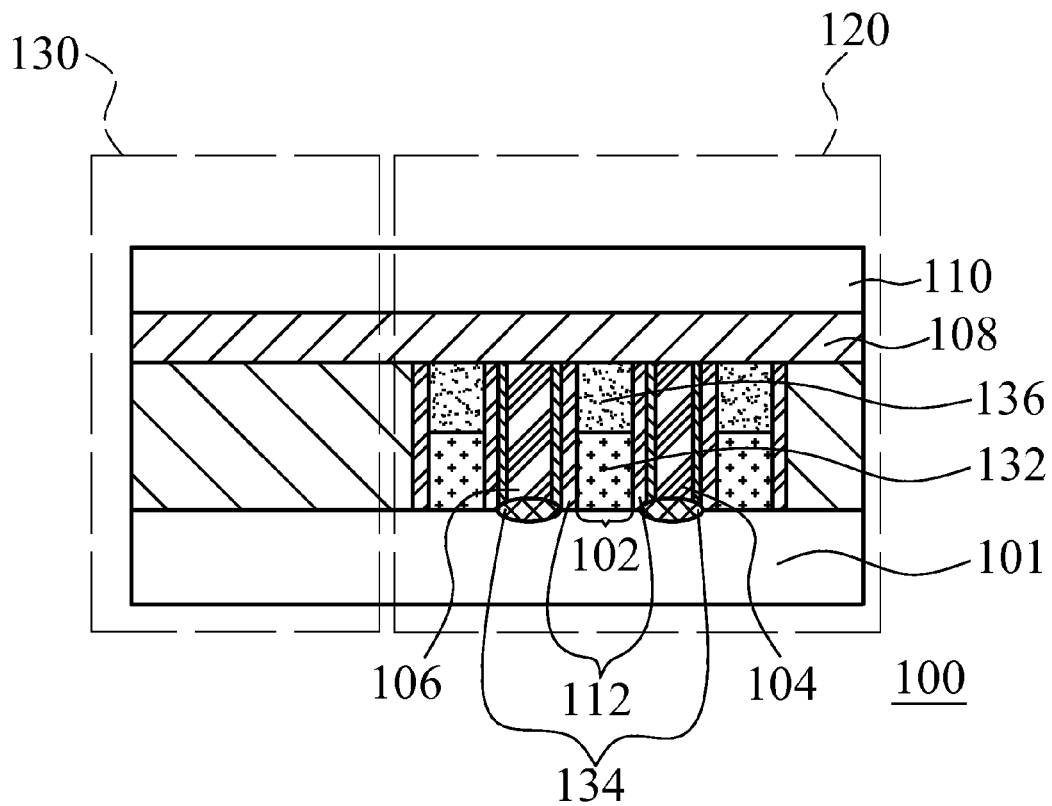
FIG. 1 is a sectional view illustrating an exemplary semiconductor device according to an exemplary embodiment.

FIG. 1 is a sectional view illustrating an exemplary semiconductor device according to an exemplary embodiment. As shown in FIG. 1, a semiconductor device 100 is provided. In the semiconductor device 100, a first conductive portion 102, a second conductive portion 104, and a third conductive portion 106 are provided over a substrate 101. A dielectric layer 108 is formed over the first conductive portion 102, the second conductive portion 104, and the third conductive portion 106. A high-resistance layer 110 is formed over the dielectric layer 108. In the exemplary embodiment, the resistance of the high-resistance layer 110 is, for example, about 500-1500 Ohm/cm$^2$.

The first conductive portion 102, the second conductive portion 104, and the third conductive portion 106 may be separated by an insulator 112, such as silicon nitride. Each of the first conductive portion 102, the second conductive portion 104, and the third conductive portion 106 may be a contact, a source/drain, or a gate. For example, in the exemplary embodiment, the first conductive portion 102 is a gate, and the second conductive portion 104 and the third conductive portion 106 are contacts. The dielectric layer 108 may be used as a contact etch stop layer and may be formed of, for example, SiN, SiON, or SiOCN. The high-resistance layer 110 may be formed of, for example, TiN or AlN and may have a thickness of, for example, 10 angstroms to 100 angstroms.

Additionally, the semiconductor device 100 may include a core region 120 and a peripheral region 130 which is outside the core region 120. The core region 120 may be a region for placing standard cells; the peripheral region 130 may be a region for placing input/output ports. The first conductive portion 102, the second conductive portion 104, and the third conductive portion 106 may be provided inside the core region 120 of the semiconductor device 100. The first conductive portion 102 may include a gate metal 136 and a poly-silicon portion 132. The semiconductor device 100 may further include a nickel silicide portion 134.

Figure 2:
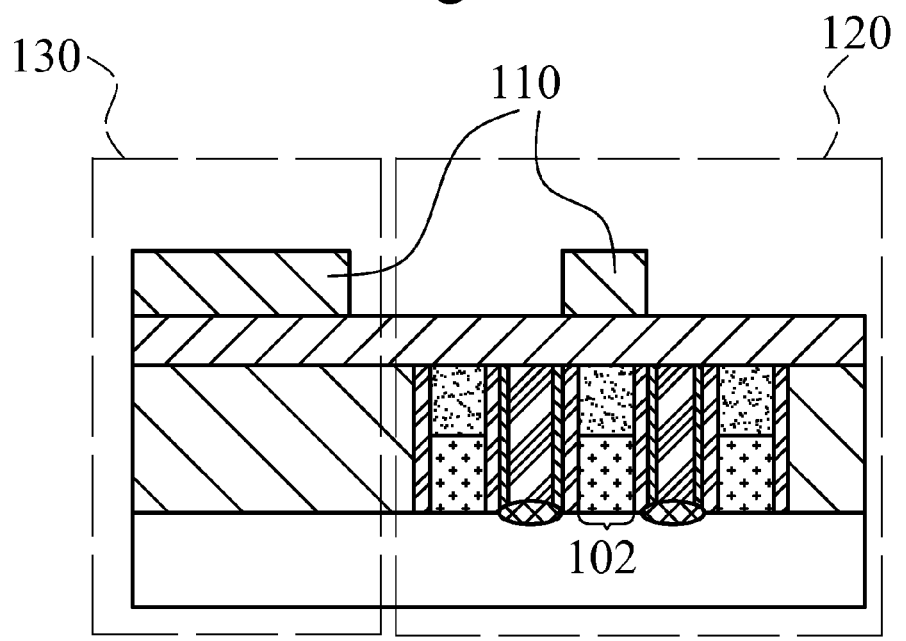
FIG. 2 is a sectional view illustrating the exemplary semiconductor device according to the exemplary embodiment.

FIG. 2 is a sectional view illustrating the exemplary semiconductor device according to the exemplary embodiment. As shown in FIG. 2, by using an etching process, the high-resistance layer 110 is patterned to have a portion of the high-resistance layer 110 over the first conductive portion 102. Furthermore, the high-resistance layer 110 is also patterned to form as a resistor in the peripheral region 130 outside the core region 120 of the semiconductor device 100.

Figure 3:
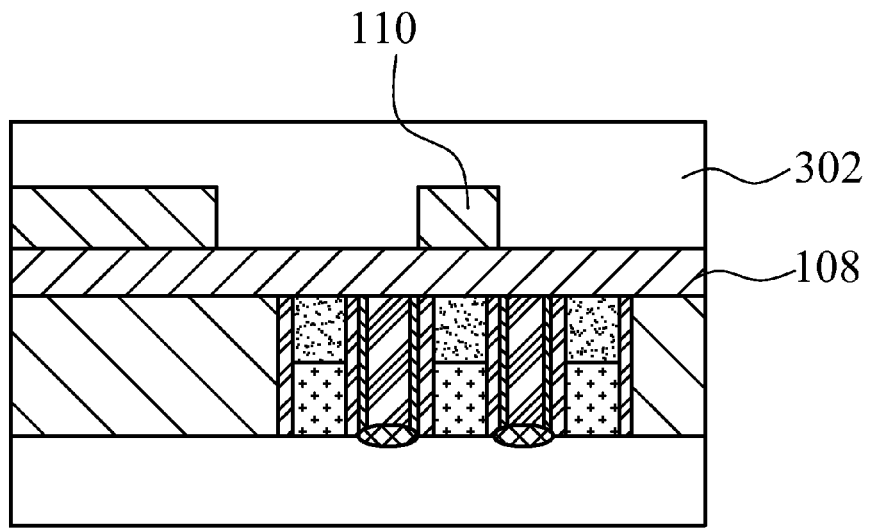
FIG. 3 is a sectional view illustrating the exemplary semiconductor device according to the exemplary embodiment.

FIG. 3 is a sectional view illustrating the exemplary semiconductor device according to the exemplary embodiment. As shown in FIG. 3, an oxide layer 302 is formed over the high-resistance layer 110 and the dielectric layer 108. The oxide layer 302 may be formed of a plasma enhanced oxide layer.

Figure 4:
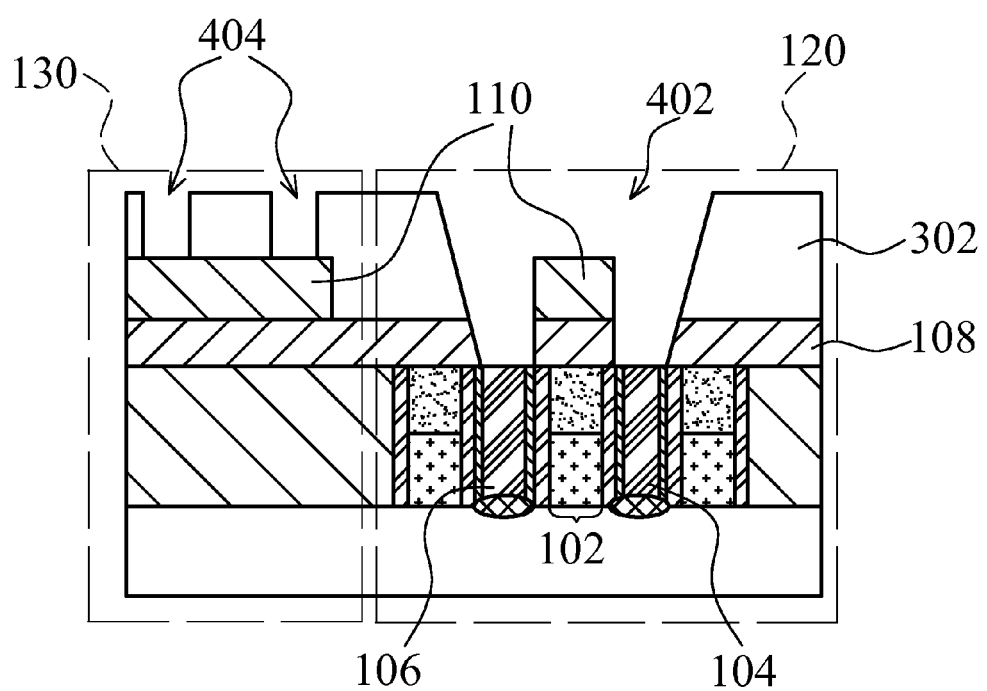
FIG. 4 is a sectional view illustrating the exemplary semiconductor device according to the exemplary embodiment.

FIG. 4 is a sectional view illustrating the exemplary semiconductor device according to the exemplary embodiment. As shown in FIG. 4, the dielectric layer 108 and the oxide layer 302 are patterned by using the high-resistance layer 110 as a blocking layer to form a first recess 402 to expose the second conductive portion 104 and the third conductive portion 106 and to prevent the first conductive portion 102 from exposure. Additionally, the oxide layer 302 over the high-resistance layer 110 in the peripheral region 130 outside the core region 120 may be also patterned to have at least one second recess 404.

Figure 5:
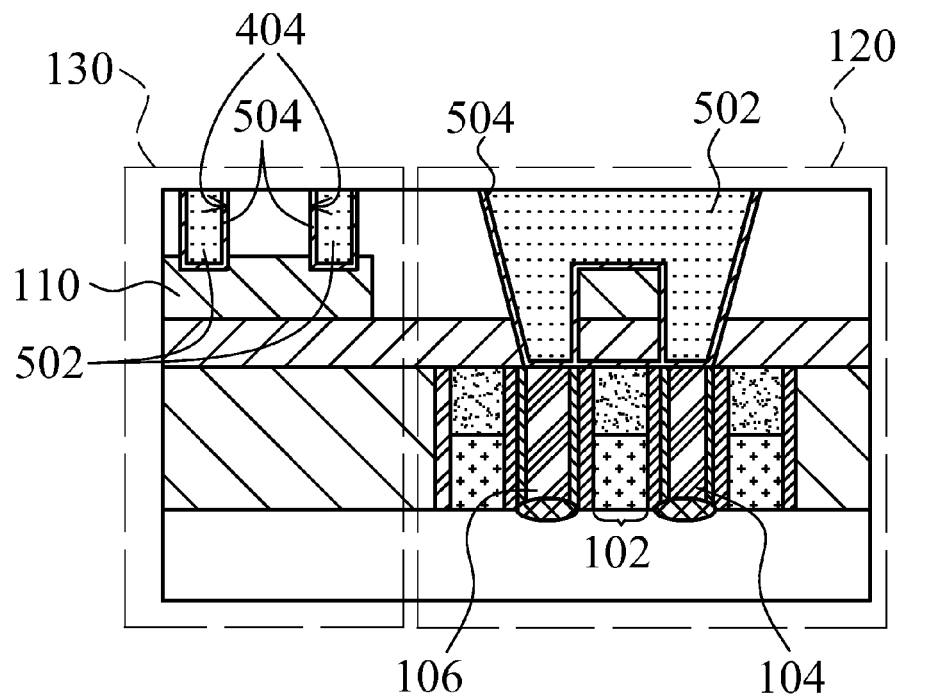
FIG. 5 is a sectional view illustrating the exemplary semiconductor device according to the exemplary embodiment.

FIG. 5 is a sectional view illustrating the exemplary semiconductor device according to the exemplary embodiment. As shown in FIG. 5, a plug layer 502 is formed in the first recess 402 to connect the second conductive portion 104 and the third conductive portion 106. The plug layer 502 may be formed of tungsten. The plug layer 502 may be formed in the second recess 404 to have the high-resistance layer 110 in the peripheral region 130 connectable by other layer or other portion. Additionally, a glue layer 504 may be formed on the surface of the first recess 402 and the surface of the second recess 404. The glue layer 504 may be formed of a compound of, for example, Ti and TiN.

In the exemplary embodiment, the high-resistance layer 110 is used in the core area as a blocking layer to provide a flyover or a bridge between the second conductive portion 104 and the third conductive portion 106 without electrically connecting the first conductive portion 102. It may also improve routing for the layout design so as to increase overall gate density of the semiconductor device 100.

Figure 6:
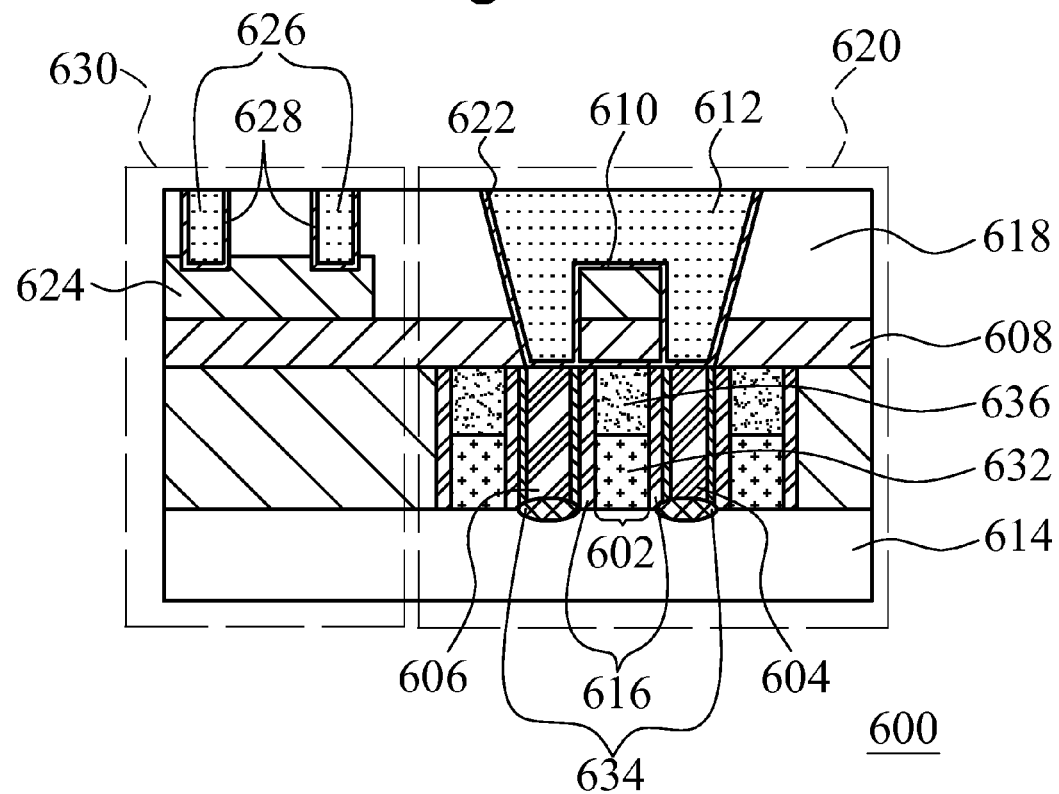
FIG. 6 is a sectional view illustrating an exemplary semiconductor device according to the exemplary embodiment.

FIG. 6 is a sectional view illustrating an exemplary semiconductor device according to the exemplary embodiment. A semiconductor device 600 is provided. The semiconductor device 600 includes a first conductive portion 602, a second conductive portion 604, a third conductive portion 606, a dielectric layer 608, a first high-resistance portion 610, and a first plug portion 612. The first conductive portion 602, the second conductive portion 604, the third conductive portion 606 are disposed over a substrate 614. The dielectric layer 608 is disposed over the first conductive portion 602. The first high-resistance portion 610 is disposed over the dielectric layer 608. The first plug portion 612 is disposed over the first high-resistance portion 610, the second conductive portion 604, and the third conductive portion 606. The first plug portion 612 electrically connects the second conductive portion 604 and the third conductive portion 606.

In the exemplary embodiment, the high-resistance layer 610 is used in the core area as a blocking layer to provide a flyover or a bridge between the second conductive portion 604 and the third conductive portion 606 without electrically connecting the first conductive portion 602. It may also improve routing for the layout design so as to increase overall gate density of the semiconductor device 600.

In the exemplary embodiment, the first conductive portion 602, the second conductive portion 604, and the third conductive portion 606 may be separated by an insulator 616, such as silicon nitride. Each of the first conductive portion 602, the second conductive portion 604, and the third conductive portion 606 may be a contact, a source/drain, or a gate. For example, in the exemplary embodiment, the first conductive portion 102 is a gate, and the second conductive portion 104 and the third conductive portion 606 are contacts. The dielectric layer 608 may be used as a contact etch stop layer and may be formed of, for example, SiN, SiON or SiOCN. The high-resistance layer 610 may be formed of, for example, TiN or AlN and may have a thickness of, for example, 10 angstroms to 100 angstroms. Additionally, the semiconductor device 600 may include a core region 620 and a peripheral region 630 which is outside the core region 620. The first conductive portion 602, the second conductive portion 604, and the third conductive portion 606 may be provided inside the core region 620 of the semiconductor device 600. The first conductive portion 602 may include a gate metal 636 and a poly-silicon portion 632. The semiconductor device 600 may further include a nickel silicide portion 634.

In the exemplary embodiment, the first plug portion 612 may be formed of tungsten. In the exemplary embodiment, the semiconductor device 600 may further include an oxide layer 618. The oxide layer 618 may be disposed over the dielectric layer 608 and surround the first plug portion 612.

In the exemplary embodiment, the semiconductor device 600 may further include a first glue portion 622 on the surface of the first plug portion 612 which is adjacent to the oxide layer 618, the dielectric layer 608, the first high-resistance portion 610, the second conductive portion 604, and the third conductive portion 606. The first glue portion 622 may be formed of a compound of Ti/TiN.

In the exemplary embodiment, the semiconductor device 600 may further include a second high-resistance portion 624 over the dielectric layer 608. The second high-resistance portion 624 may be used as a resistor in the peripheral region 630 outside the core region 620 of the semiconductor device 600.

In the exemplary embodiment, the semiconductor device 600 may further include second plug portions 626 in the peripheral region 630 outside the core region 620 of the semiconductor device 600. The second plug portions 626 may have the second high-resistance portion 624 electrically connectable by other layer or other portion.

In the exemplary embodiment, the semiconductor device 600 may further include a second glue portion 628 on a surface of the second plug portion 626 which is adjacent to the oxide layer 618, and the second high-resistance portion 624. The second plug portion 626 may be formed of a compound of Ti and TiN.

Figure 7:
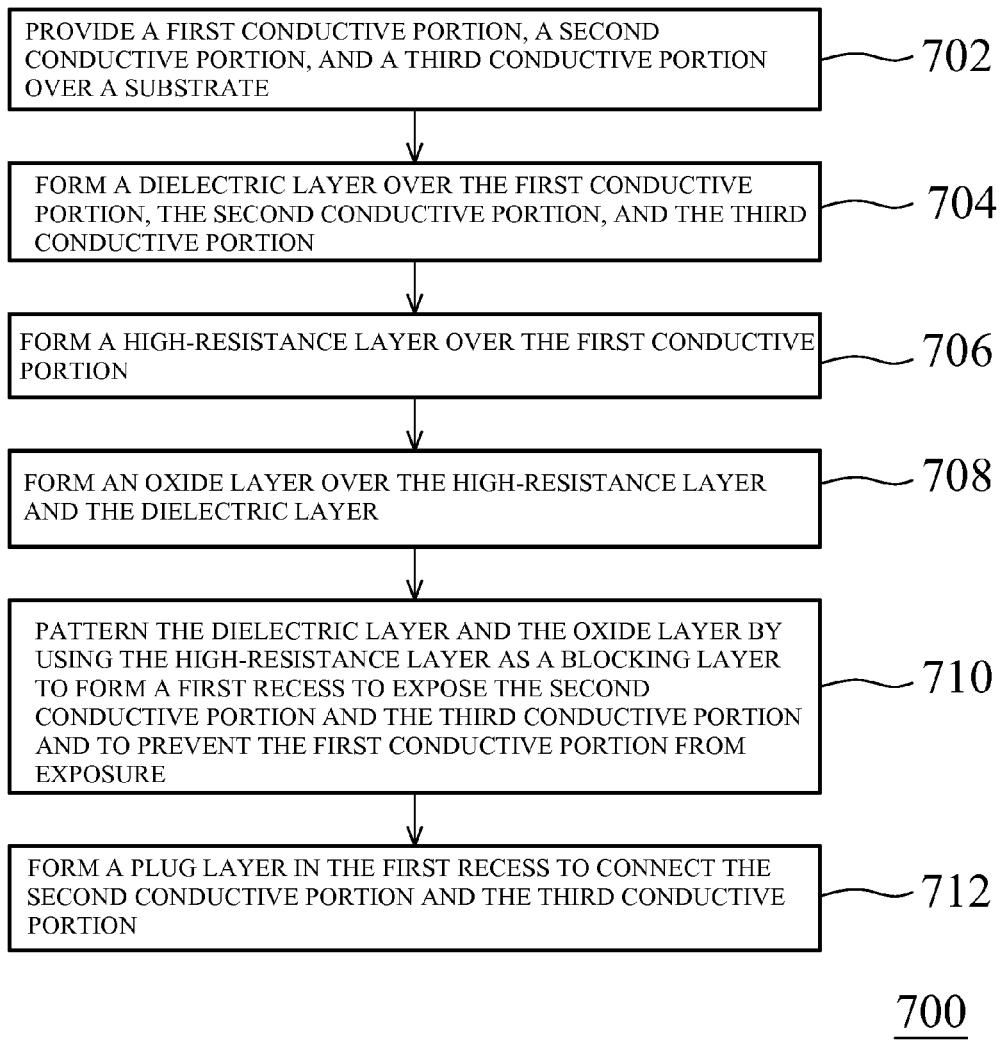
FIG. 7 is a flow chart for manufacturing operation according to an exemplary embodiment.

FIG. 7 is a flow chart for manufacturing operation according to an exemplary embodiment. As shown in FIG. 7, a method 700 is provided. The method 700 includes the following operations: providing a first conductive portion, a second conductive portion, and a third conductive portion over a substrate (702); forming a dielectric layer over the first conductive portion, the second conductive portion, and the third conductive portion (704); forming a high-resistance layer over the first conductive portion (706); forming an oxide layer over the high-resistance layer and the dielectric layer (708); patterning the dielectric layer and the oxide layer by using the high-resistance layer as a blocking layer to form a first recess to expose the second conductive portion and the third conductive portion and to prevent the first conductive portion from exposure (710); and forming a plug layer in the first recess to connect the second conductive portion and the third conductive portion (712).

In the exemplary embodiment, the operation of forming the high-resistance layer over the first conductive portion may include forming a titanium nitride layer or an aluminum nitride layer over the first conductive portion. In the exemplary embodiment, the operation of forming the dielectric layer may include forming the dielectric layer as an etch stop layer. In the exemplary embodiment, the operation of forming the oxide layer may include forming a plasma enhanced oxide layer. In the exemplary embodiment, the operation of forming the plug layer in the first recess may include forming a tungsten layer in the first recess.

In the exemplary embodiment, the method may further include forming a glue layer on a surface of the first recess. In the exemplary embodiment, the operation of providing the first conductive portion, the second conductive portion and the third conductive portion may further include providing the first conductive portion, the second conductive portion and the third conductive portion inside a core region of a semiconductor device. In the exemplary embodiment, the operation of forming the high-resistance layer may further include forming the high-resistance layer as a resistor outside the core region of the semiconductor device. In the exemplary embodiment, the operation of patterning the oxide layer may include patterning the oxide layer over the high-resistance layer outside the core region to have a second recess. In the exemplary embodiment, the method may further include forming the plug layer in the second recess to have the high-resistance layer outside the core region electrically connected.

This written description uses examples in the disclosure to: disclose the best mode and also to enable a person ordinarily skilled in the art to make and use the disclosure. The patentable scope may include other examples that occur to those skilled in the art.

One skilled in the relevant art upon reading this disclosure will recognize that the various embodiments may be practiced without one or more of the specific details, or with other replacement and/or additional methods, materials, or components. Well-known structures, materials, or operations may not be shown or described in detail to avoid obscuring aspects of various embodiments. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A method for manufacturing a semiconductor device, comprising:
    providing a first conductive portion, a second conductive portion and a third conductive portion over a substrate;
    forming a dielectric layer over the first conductive portion, the second conductive portion, and the third conductive portion;
    forming a high-resistance layer over the first conductive portion;
    forming an oxide layer over the high-resistance layer and the dielectric layer;
    patterning the dielectric layer and the oxide layer by using the high-resistance layer as a blocking layer to form a first recess to expose the second conductive portion and the third conductive portion and to prevent the first conductive portion from exposure; and
    forming a plug layer in the first recess to connect the second conductive portion and the third conductive portion.

2. The method of claim 1, wherein the forming the high-resistance layer over the first conductive portion comprises: forming a titanium nitride layer or an aluminum nitride layer over the first conductive portion.

3. The method of claim 1, wherein the forming the dielectric layer comprises: forming the dielectric layer as an etch stop layer (ESL).

4. The method of claim 1, wherein the forming the oxide layer comprises: forming a plasma enhanced oxide layer.

5. The method of claim 1, wherein the forming the plug layer in the first recess comprises: forming a tungsten layer in the first recess.

6. The method of claim 1, further comprising: forming a glue layer over a surface of the first recess.

7. The method of claim 1, wherein the providing the first conductive portion, the second conductive portion and the third conductive portion further comprises: providing the first conductive portion, the second conductive portion and the third conductive portion inside a core region of a semiconductor device.

8. The method of claim 7, wherein the forming the high-resistance layer further comprises: forming the high-resistance layer as a resistor outside the core region of the semiconductor device.

9. The method of claim 8, wherein the patterning the oxide layer comprises: patterning the oxide layer over the high-resistance layer outside the core region to have a second recess.

10. The method of claim 9, further comprising: forming the plug layer in the second recess to have the high-resistance layer outside the core region electrically connected.

11. A semiconductor device, comprising:
    a first conductive portion over a substrate;
    a second conductive portion over the substrate;
    a third conductive portion over the substrate;
    a dielectric layer over the first conductive portion
    a first high-resistance portion over the dielectric layer; and
    a first plug portion over the first high-resistance portion, the second conductive portion, and the third conductive portion, wherein the first plug portion electrically connects the second conductive portion and the third conductive portion,
    wherein the first high-resistance portion comprises a titanium nitride layer or an aluminum nitride layer.

12. The semiconductor device of claim 11, wherein the dielectric layer is used as an etch stop layer (ESL).

13. The semiconductor device of claim 11, wherein the first plug portion comprises tungsten.

14. The semiconductor device of claim 11, further comprising: an oxide layer over the dielectric layer and surrounding the first plug portion.

15. The semiconductor device of claim 14, further comprising: a first glue portion over a surface of the first plug portion connecting to the oxide layer, the dielectric layer, the first high-resistance portion, the second conductive portion, and the third conductive portion.

16. The semiconductor device of claim 15, wherein the first conductive portion, the second conductive portion and the third conductive portion are disposed inside a core region of a semiconductor device.

17. The semiconductor device of claim 16, further comprising: a second high-resistance portion over the dielectric layer and used as a resistor outside the core region of the semiconductor device.

18. The semiconductor device of claim 17, further comprising: a second plug portion outside the core region of the semiconductor device, for having the second high-resistance portion outside the core region electrically connected.

19. The semiconductor device of claim 18, further comprising: a second glue portion over a surface of the second plug portion connecting to the oxide layer, and the second high-resistance portion.

20. A semiconductor device, comprising:
a first conductive portion over a substrate;
a second conductive portion over the substrate;
a third conductive portion over the substrate;
a dielectric layer over the first conductive portion;
a first high-resistance portion over the dielectric layer;
a resistor made of a second high-resistance portion over the dielectric layer outside a core region of the semiconductor device, wherein the first high-resistance portion and the second high-resistance portion are formed of the same material; and
a first plug portion over the first high-resistance portion, the second conductive portion, and the third conductive portion, wherein the first plug portion electrically connects the second conductive portion and the third conductive portion,
wherein the first conductive portion, the second conductive portion and the third conductive portion are disposed inside the core region of the semiconductor device.

* * * * *